United States Patent [19]
Robin et al.

[11] Patent Number: 4,649,312

[45] Date of Patent: Mar. 10, 1987

[54] REINFORCED PIEZOELECTRIC TRANSDUCER AND PRESSURE SENSOR USING SUCH A TRANSDUCER

[75] Inventors: Philippe Robin, Sceaux; Francois Micheron, Gif sur Yvette; Patrick Petit, Villejuif; Dominique Broussoux, Marcoussis, all of France

[73] Assignee: Thomson-CSF, Paris, France

[21] Appl. No.: 755,094

[22] Filed: Jul. 15, 1985

[30] Foreign Application Priority Data

Jul. 13, 1984 [FR] France .................................. 84 11181

[51] Int. Cl.$^4$ ............................................. H01L 41/08
[52] U.S. Cl. ...................... 310/330; 310/332; 310/357; 310/359; 310/800; 310/338; 310/319
[58] Field of Search ............... 310/800, 338, 357–359, 310/364, 363, 365, 366, 317, 319, 330–332

[56] References Cited

U.S. PATENT DOCUMENTS

| | | | |
|---|---|---|---|
| 2,900,536 | 8/1959 | Palo | 310/358 X |
| 3,070,775 | 12/1962 | Andrews, Jr. | 310/357 X |
| 4,349,762 | 9/1982 | Kitamura et al. | 310/332 |
| 4,369,391 | 1/1983 | Micheron | 310/332 X |
| 4,378,721 | 4/1983 | Kaneko et al. | 310/800 X |
| 4,400,642 | 8/1983 | Kiraly | 310/800 X |
| 4,406,323 | 9/1983 | Edelman | 310/800 X |

*Primary Examiner*—Mark O. Budd
*Attorney, Agent, or Firm*—Oblon, Fisher, Spivak, McClelland, & Maier

[57] ABSTRACT

A piezoelectric transducer including a polarized piezoelectric material film, which also has a reinforcing material incorporated into the mass and which prevents any deformation of the film in certain given directions.

The invention also relates to a pressure sensor using such a transducer.

This sensor can be used both as a pressure sensor and as a pressure gradient measuring device.

14 Claims, 12 Drawing Figures

FIG_1
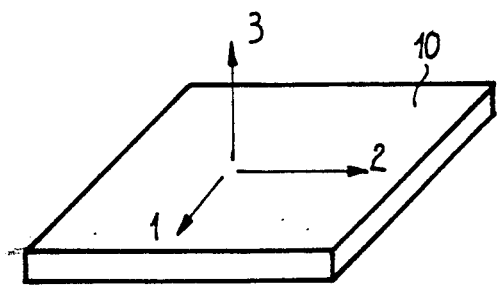
FIG_2
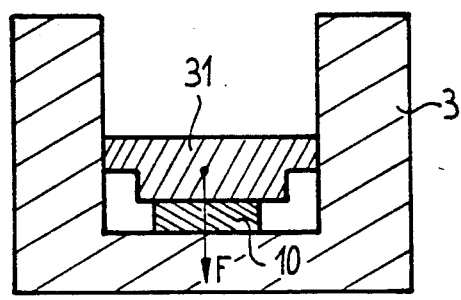
FIG_3
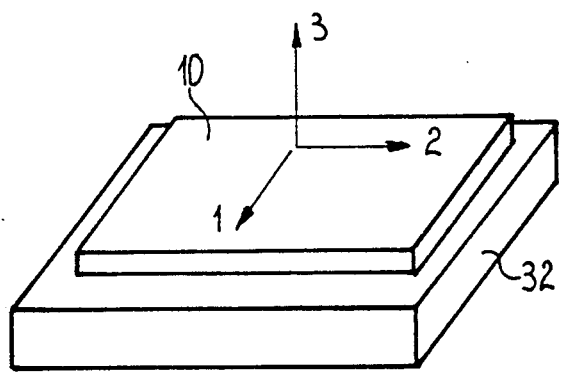

FIG_4
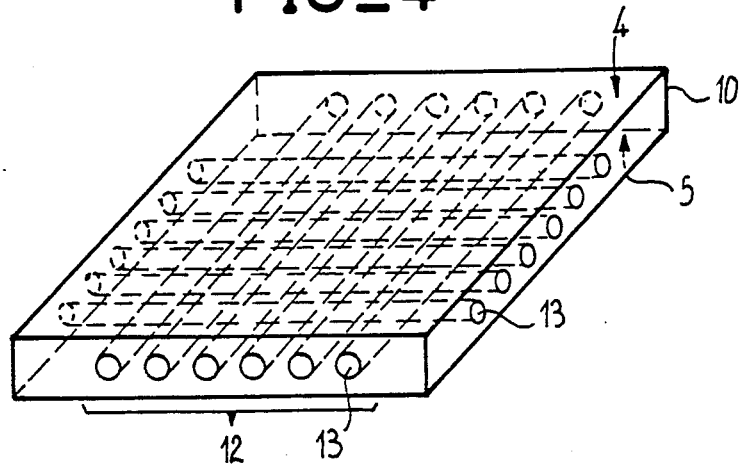
FIG_5
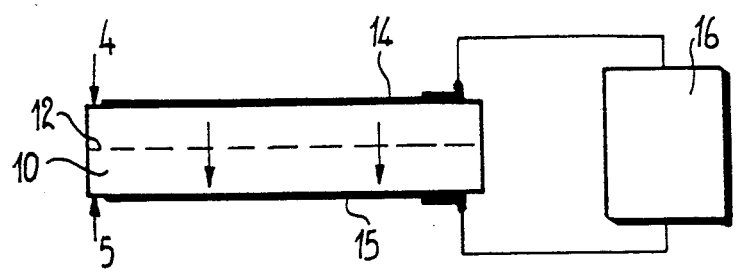
FIG_6
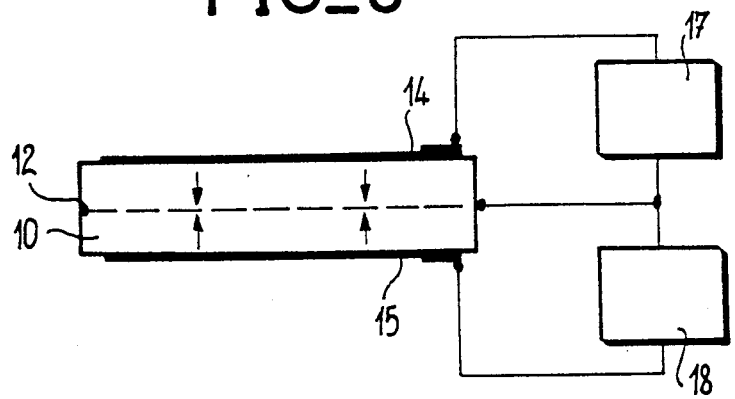

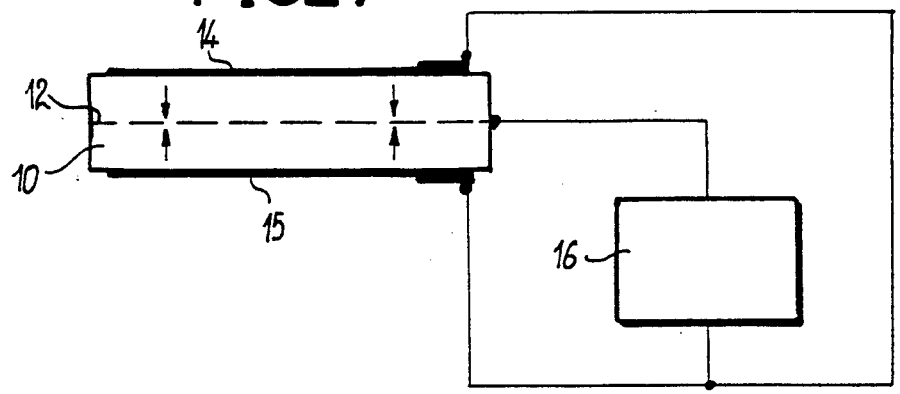
FIG_7
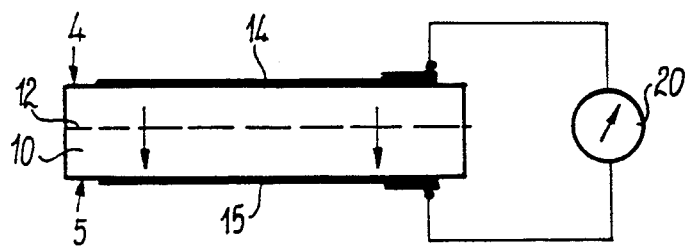
FIG_8
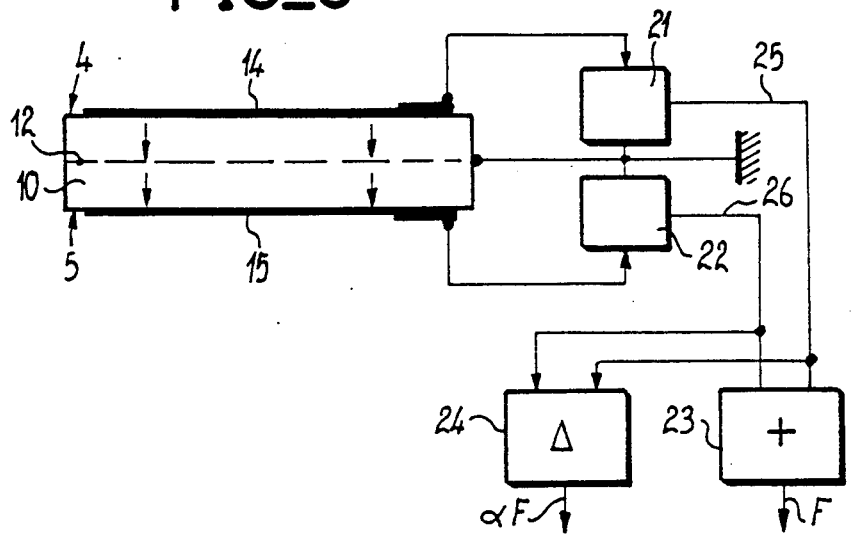
FIG_9

FIG_10
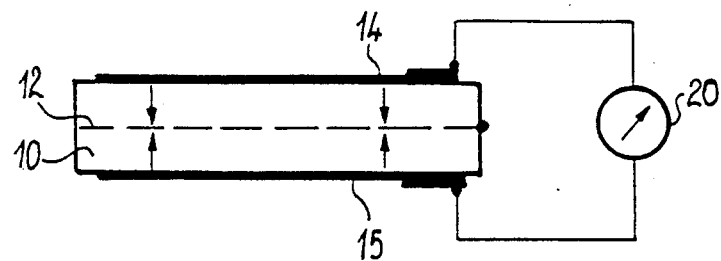
FIG_11
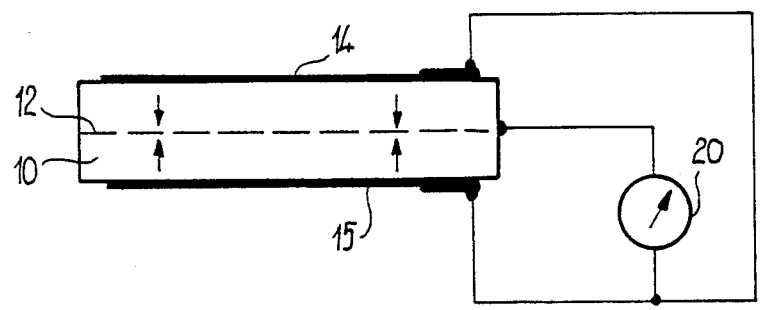
FIG_12
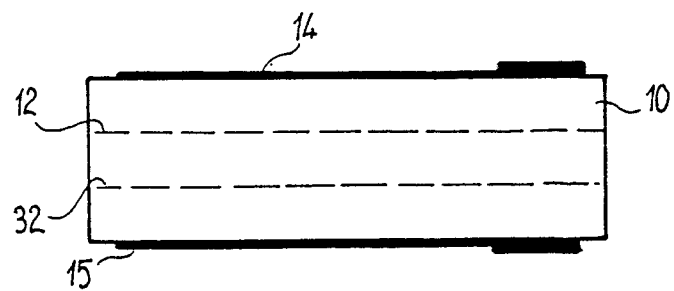

REINFORCED PIEZOELECTRIC TRANSDUCER AND PRESSURE SENSOR USING SUCH A TRANSDUCER

BACKGROUND OF THE INVENTION

The present invention relates to a piezoelectric transducer, as well as to a pressure sensor or microphone using such a transducer and which more particularly makes it possible to measure pressure or compressive force values, pressure or compressive force gradient values, as well as bends or curves.

Numerous materials have piezoelectric properties or can have such effects following an appropriate treatment. Piezoelectric materials also have pyroelectric properties. Reference can e.g. be made to polarized ferroelectric ceramics or monocrystalline quartz. More recently, piezoelectric polymers have appeared. The latter are used in the form of flat film metallized on both faces and which are mechanically or non-mechanically oriented and are in all cases polarized by applying an intense electric field (approximately 1 MV/cm) at a temperature equal to or above ambient temperature. As a result of this treatment, the polymer material films acquire pyroelectric and piezoelectric properties making it possible to use them as transducers. Applications of such flat or planar films are as pressure or displacement sensors (microphones, hydrophones, strain gauges, etc) and temperature sensors (pyroelectric sensor for the detection of intruders and for infrared imaging).

Polymers usable for this purpose are e.g. polyvinylidene fluoride ($PVF_2$), polyvinylchloride (PVC), polyvinylfluoride (PVF), as well as copolymers such as e.g. polytetrafluoroethylene-polyvinylidene fluoride ($PTFE-PVF_2$) and polyvinylidene fluoride-polytrifluoroethylene ($PVF_2-PTrFE$). Flat films of these polymers are conventionally obtained by extrusion blowing, calendering, pressing or solvent evaporation.

The hydrostatic piezoelectric coefficient $d_{3h}$ of a material can be broken down into three components. For example, for a piezoelectric material sheet like that shown in FIG. 1, the hydrostatic piezoelectric coefficient $d_{3h}$ of the material is broken down into the sum of three uniaxial piezoelectric coefficients:

$$d_{3h} = d_{31} + d_{32} + d_{33}$$

In numerous materials, particularly in polyvinylidenefluoride $PVF_2$ and its copolymers, the signs of the coefficients $d_{31}$ and $d_{32}$ are opposte to that of $d_{33}$. This leads to a low value of three $d_{3h}$. In order to befenit from a high sensitivity to hydrostatic stresses, it is e.g. necessary to enclose the active material in a tight steel enclosure and which has a piston applying the pressure uniaxially to the active material in the manner shown in FIG. 2.

A piezoelectric film 10 is placed in a tight enclosure 30 so as to be flat on the bottom thereof. A piston 31 slides in said enclosure 30 and makes it possible to apply a compressive force F to be measured on the piezoelectric film 10. The mechanisms for applying a force F to piston 31 are not shown, but a force F to be applied to the piezoelectric film will necessarily be applied in the displacement direction of piston 31. In this type of arrangement, we have:

$$d_{3h} = d_{33}$$

However, this solution suffers from the disadvantage of requiring precise arrangements, due to the system having to be tight, as well as the loss-free transmission of the forces to be measured and is not suitable for the production of large hydrostatic sensors. Therefore, such a solution is costly.

Another solution, shown in FIG. 3, comprises adhering the piezoelectric film 10 to a rigid support 32 having a very high Young's modulus. Thus, any force which can exist in accordance with the plane of film 1 is opposed by the strength of support 32.

If $v$ is Poisson's ratio of the piezoelectric material, we obtain:

$$d_{3h} = \frac{v}{1-v}(d_{31} + d_{32}) + d_{33}$$

As $v = 0.3$ for a piezoelectric material, we obtain:

$$d_{3h} \approx 0.5(d_{31}+d_{32})+d_{33},$$

which is of interest because $d_{31}$ and $d_{32}$ have opposite signs to $d_{33}$.

However, the latter method is not suitable for the production of large transducers, and this amounts to the same thing, for the production of small transducers by cutting up a large transducer.

Therefore, the present invention proposes a piezoelectric transducer produced in the form of a film and having the same characteristics over its complete area.

BRIEF SUMMARY OF THE INVENTION

The invention therefore relates to a piezoelectric transducer having a polarized piezoelectric material film and which also incorporates a reinforcing material, which is incorporated into the mass of the film opposing the deformation thereof in certain given directions.

The invention also relates to a pressure sensor using such a transistor.

BRIEF DESCRIPTION OF THE DRAWINGS

The invention is described in greater detail hereinafter relative to non-limitative embodiments and with reference to the attached drawings, wherein show:

FIG. 1 an example of a piezoelectric transducer.

FIG. 2 a connection example of a transducer according to the prior art.

FIG. 3 another example of the connection according to the prior art.

FIG. 4 an embodiment of the piezoelectric film according to the invention.

FIG. 5 a circuit making it possible to polarize the piezoelectric film in a single polarization direction.

FIGS. 6 and 7 circuits making it possible to polarize the piezoelectric film in two opposite polarization directions.

FIG. 8 an example of a known pressure sensor.

FIG. 9 an embodiment of a pressure sensor according to the invention using a film polarized according to a polarization threshold.

FIGS. 10 and 11 embodiments of the pressure sensor according to the invention using films polarized in two opposite directions.

FIG. 12 a variant of an embodiment of a transducer according to the invention.

DETAILED DESCRIPTION OF THE PREFERRED EMBODIMENTS

As described hereinbefore relative to FIG. 1, a piezoelectric material 1 has a hydrostatic piezoelectric coefficient $d_{3h}$, which can be broken down into three parts in directions 1, 2 and 3, defined by a reference trihedron, such that:

$$d_{3h} = d_{31} + d_{32} + d_{33}$$

In order to have a high hydrostatic piezoelectric effect in the case of measuring a compressive force, it is advantageous to reduce the piezoelectric effects $d_{31}$ and $d_{32}$, because they have opposite signs to $d_{33}$ and for this purpose it is necessary to reduce the influence of the corresponding components of the piezoelectric coefficient $d_{3h}$.

In order to homogenize the constraints, it is possible to sandwich the film between two rigid supports but this makes the arrangement more complicated and has the supplementary disadvantage of introducing an impedance break.

With reference to FIG. 4, a description will be given of a transducer according to the invention making it possible to obviate the aforementioned disadvantages.

According to the invention, a rigid material 12 is placed in the mass of a piezoelectric material film 10 to prevent any deformation of the piezoelectric material in directions parallel to the plane of the film. This material can be a porous or perforated member. In this way, the reinforcing material is really included in the polymer.

According to an embodiment shown in FIG. 4, the rigid material 12 is constituted by fibres 13. The latter are either braided with one another, or are bonded together at their intersection points to form a gauze or grid. This grid 12 is placed flat and is overmoulded with the aid of the piezoelectric material 10, so that each of the fibres is coated with the piezoelectric material. The grid 12 and the piezoelectric material form a integral piece. The obtained film is not very sensitive for any compressive or extension force exerted in accordance with the plane of the film. Under these conditions, the piezoelectric effect due to the compressive forces normal to the plane of the film is preponderant. Thus, the transverse reinforcement of the piezoelectric material aims at benefiting from the reduction of the effect of coefficient $d_{31}$ and $d_{32}$ in the formula $d_{3h} = d_{31} + d_{32} = D_{33}$. The measurement of this piezoelectric effect by measuring the potential difference between the two main faces of the film makes it possible to more easily translate the value of the compressive force exerted.

The aforementioned embodiment (transverse reinforcement of the film) is more particularly suitable for applications of submarine acoustic measurements. In other applications, it is possible to provide other reinforcement directions. Thus, the piezoelectric material could be reinforced in directions 1, 2 or 3, or 1 and 2, 2 and 3 or 1 and 3, or in different directions 1 and 2 and 3.

According to an embodiment, the piezoelectric material used can be a semicrystalline polymer, such as polyvinylidene fluoride (PVF$_2$) or a copolymer obtained by combining this polymer with e.g. polytetrafluoroethylene (PTFE).

The reinforcing material can be of a conductive or insulating nature. Thus, in the case of a conductive material, consideration can be given to a metal grid. In the case of an insulating material, a fabric of glass fibres, Kevlar or polymer fibres would be suitable.

When using the copolymer PVF$_2$-PTrFE, the fabric is included in the polymer on fusion during the formation of the composite film.

In the example of materials for submarine acoustic applications, a low density composite material is obtained, which has a good impedance matching with respect to water.

The following results were obtained through measurements performed on such materials.

A PVFE-PTrFE copolymer film with 60% polyvinylidene fluoride (PVF$_2$) and 40% polytrifluoroethylene (PTrFE) of thickness 1.6 mm, containing no reinforcing material and polarized to 80° C. relative to a 130 kV/cm electric field has:

an electrical permittivity $\epsilon_r = 12$ a hydrostatic piezoelectric coefficient $d_{3h} = 4$ pC/N (pico-Coulomb par Newton).

A film of the same composition and thickness polarized in the same conditions as hereinbefore and into which has been incorporated a polyester fabric has the characteristics $\epsilon_r = 9$ $d_{3h} = 11$ pC/N A PVF$_2$-PTrFE copolymer film with 67% PVF$_2$ and 33% PTrFE of thickness 1 m, containing no reinforcing material and polarized to 80° C. with the aid of a 190 kV/cm electric field has the characteristics $\epsilon_r = 10.6$ $d_{3h} = 4$ pC/N.

A PVF$_2$-PTrFE film containing 67% PVF$_2$ and 33% PTrFE having the same dimensions, but containing a polyester fabric has the characteristics $\epsilon_r = 10$ $d_{3h} = 9$ pC/N.

In the two preceding cases where a reinforcing fabric has been provided in the structure of the film, there has been a considerable rise in the $d_{3h}$, as well as a reduction in the dielectric constant.

If the material is used in a hydrostatic sensor, it is the coefficient $gh = d_{3h}/\epsilon_r$ which measures the performances of the material. Thus, the proposed structure has very high performance characteristics. The figure of merit $g_h d_h$ of a low frequency hydrophone is improved by a factor of 10 in the case of the PVF$_2$-PTrFE copolymer in a proportion of 60% of the former and 40% of the latter and a factor of 5 in the case of the 67/33 composition.

Thus, it is clear that the structure of the piezoelectric transducer according to the invention makes it possible to more sensitively measure the hydrostatic pressure force and particularly to improve the signal-to-noise ratio of the detection system.

It should be noted that the piezoelectric material can be electrically polarized before or after inclusion of the reinforcing material, electrical polarization being performable in different ways.

In the case where the material is polarized before the inclusion of the reinforcing material, adhesion takes place on the two films receiving the reinforcing material in sandwich manner between them. Epoxy resin-type adhesives are used. It is then advantageous to coat the PVF$_2$ polymer reinforcing material by impregnation in a solution of e.g. PVF$_2$ and dimethyl formamide solvent. Another possibility offered by adhesion is the use of low temperature reinforcing materials of the Kevlar type, because adhesion takes place at a temperature close to ambient temperature. For example, the two faces 4, 5 of film 10 are coated with metallic deposits 14, 15 constituting two electrodes.

According to a first method shown in FIG. 5, film 10 is exposed to an electric field with the aid of a high voltage generator 16 connected to electrodes 14, 15, no matter whether the reinforcing material 12 is conductive or insulating. The piezoelectric material is polarized according to an indicated polarization direction, of e.g. the arrows in FIG. 5.

According to a second method shown in FIG. 6, the reinforcing material is conductive. It is e.g. a metal grid 12, which is then used as the electrode. A first electrical generator 17 is connected between the first electrode 14 and grid 12 and a second electrical generator 18, which is appropriately polarized with respect to the first generator, is connected between grid 12 and the second electrode 15. The two parts of film 10 located on either side of the grid 12 are exposed to reverse electric fields, which polarize them in opposite directions. This is indicated by the opposing arrows in FIG. 6.

This second method can be carried out with a single electrical generator 16, as shown in FIG. 7. An output terminal of generator 16 is then connected to the metal grid 12 and the other output terminal of generator 16 is connected to the two electrodes 14, 15. As the piezoelectric material of film 10 is polarized, one has a piezoelectric transducer, which can e.g. be used in a pressure sensor or microphone.

It should be noted that hereinbefore, the film has been polarized in a direction perpendicular to the plane of the film, but it is obviously possible to choose another direction, e.g. in the plane of the film by providing interdigitated electrodes on one face of the film.

According to a known arrangement shown in FIG. 8, to the electrodes 14, 15 of a film 10, polarized as described in connection with FIG. 5, is connected a voltmeter 20. Hydrostatic pressure forces applied to film 10 and giving rise, by a piezoelectric effect, to the formation of a potential difference between the two faces will be measured by the voltage value detected by voltmeter 20. This constitutes the standard use of a piezoelectric transducer.

The invention supplies an application of the aforementioned transducer to a force sensor making it possible to measure a compressive force of a compressive force gradient.

The transducer used has a metal grid 12, which defines two polarization ranges in film 10. It will firstly be considered that the polarization directions of these two ranges are the same, as shown on the film of FIG. 5. According to the invention, a first voltmeter 21 is connected between electrode 14 and metal grid 12, whilst a second voltmeter 22 is connected between electrode 15 and grid 12. For example, in FIG. 9, grid 12, i.e. the common point of the two devices 21, 22 is connected to zero potential.

When a compressive force is applied to film 10, a voltage is produced by the piezoelectric effect between electrode 14 and grid 12 on the one hand and between electrode 15 and grid 12 on the other. The voltmeters 21, 22 measure the voltages produced and supply in each case on their output 25, 26 a measurement signal representing a detected compressive force. Outputs 25, 26 are connected to the inputs of an adder 23 and a subtractor 24. Adder 23 produces the sum of the measurement results received at its inputs and supplies at an output F a signal representing the compressive force exerted on film 10. Subtractor 24 forms the difference of the measurement results received at its inputs and supplies at an output dF a signal representing the value of a pressure gradient detected between the two faces 4 and 5 of film 10.

Thus, the sensor according to the invention makes it possible to perform, as required, pressure measurements or pressure gradient measurements.

With reference to FIGS. 10 and 11, a description will now be given of variants of sensors according to the invention using a film polarized as in FIG. 6, i.e. having two regions polarized in opposite directions on either side of grid 12.

It should firstly be noted that such a film can be used in a sensor, like that of FIG. 9, whilst taking acount of the polarization directions for the connection of the voltmeters 21, 22. More simply, it can be used in a pressure gradientmeter, as shown in FIG. 10. In FIG. 10, a voltmeter 20 is connected to electrodes 14, 15. As a result of the reverse polarization directions, film 10 subjected to a pressure will consequently be able to supply to the appropriately graduated voltmeter 20 a pressure gradient value.

In an identical manner to the pressure gradient-meter of FIG. 10, the sensor of FIG. 11 is installed in a compressive force measuring apparatus. The voltmeter 20 is then connected by one of its input terminals to electrodes 14, 15. Under these conditions, the reverse polarization direction of the two regions of film 10 ensure that voltmeter 20 measures a compressive force value.

An advantage of the pressure sensor of FIG. 11 is that it has a capacitance which is substantially four times higher than the real capacitance measured between the two electrodes 14 and 15. Thus, if e is the total thickness of the piezoelectric film 10, S the surface of the film 10 used in the sensor, $\epsilon$ the dielectric constant, the real value of the capacitance between the electrodes 14 and 15 is:

$$C = \epsilon S/e.$$

Assuming that grid 12 is located in the centre of the thickness of film 10, the value of the capacitances $C_1$ and $C_2$ measured between electrode 14 and grid 12, and between electrode 15 and grid 12, has the value:

$$C_1 = C_2 = (2\epsilon S)/e$$

Thus, for voltmeter 20, the arrangement of FIG. 11 supplies a capacitance of value:

$$C_1 + C_2 = (4\epsilon S)/e.$$

For the use of the thus described sensor in a gradientmeter, preference will be given to a film in which grid 12 is substantially equidistant of the two faces 14, 15 in the thickness of the film. However, this is not imperative. However, it is appropriate to have within the film thickness, two ranges or zones of adequate size and developing measurable piezoelectric effects and to calibrate the two measurements branches given by these two zones or balance them with the aid of impedances.

Moreover, the sensor according to the invention can also be used for measuring bending forces and then preferably comprises a transducer with reverse polarization directions.

According to a variant of the invention, the transducer has several parallel grids. Thus, in FIG. 12, a transducer having two parallel grids 12, 32 is shown, said grids being embedded in the piezoelectric material 10. Thus, these grids define several piezoelectric material layers. In the case of the construction of the transistor by bonding or adhesion, the different layers can be made from different piezoelectric materials.

It should be noted that the piezoelectric material which can be used can be a polymer-piezoelectric ceramic composite material, such as a material obtained from a mineral piezoelectric powder suspension in a polymer, which does not have to be mechanically drawn out or stretched to be piezoelectric.

Finally, it is pointed out that the embodiments of the invention are not limited to flat transducers. Thus, the invention is also applicable to a transducer shaped like a developable shell (such as a tube or cone) or a non-developable shell (such as e.g. a spherical cup).

What is claimed is:

1. A piezoelectric transducer having a polarized piezoelectric material film, also comprising at least one porous reinforcing material incorporated into the mass of the film and preventing any deformation of the latter in certain given directions.

2. A piezoelectric transducer according to claim 1, wherein the reinforcing material is incorporated into the mass of the film, parallel to the main faces thereof thus preventing the deformation of the film in directions parallel to said main faces.

3. A piezoelectric transducer according to claim 1, wherein the reinforcing material is a material constituted by fibres.

4. A piezoelectric transducer according to claim 3, wherein the reinforcing material fibres are braided with one another to form a grid.

5. A piezoelectric transducer according to claim 1, wherein the reinforcing material is placed in the thickness of the piezoelectric material and is equidistant of the two opposite faces of the piezoelectric material.

6. A piezoelectric transducer according to claim 1, wherein the reinforcing material is an electrically insulating material.

7. A piezoelectric transducer according to claim 1, wherein the reinforcing material is an electrically conductive material.

8. A piezoelectric transducer according to claim 1, wherein the film is polarized perpendicular to the two main faces of the film and has on its main faces a first and a second electrode.

9. A piezoelectric transducer according to claim 1, comprising several reinforcing materials arranged in parallel.

10. A piezoelectric transducer according to claim 1, comprising several layers of piezoelectric materials separated by reinforcing materials.

11. A pressure sensor using the piezoelectric transducer according to claim 8, comprising a first voltmeter connected to the first electrode and to the reinforcing material, a second voltmeter connected to the second electrode and to the reinforcing material, an adder connected to the two voltmeters forming the sum of the measurement results carried out by the first and second voltmeters and supplying a signal representing a value of the compressive force exerted in the piezoelectric material, a subtractor connected to the two voltmeters and forming the difference of the measurement results performed by the first and second measurement means and supplying a signal representing a value of the compressive force gradient developed in the piezoelectric material.

12. A pressure sensor using the piezoelectric transducer according to claim 8, comprisng a first polarization means connected between the first electrode and the reinforcing material and making it possible to polarize the piezoelectric material, located between the first electrode and the reinforcing material in a first polarization direction, a second polarization means connected between the second electrode and the reinforcing material and making it possible to polarize the piezoelectric material between the second electrode and the reinforcing material, in a second polarization direction opposite to the first polarization direction.

13. A pressure sensor according to claim 11, comprising a voltmeter connected to the first and second electrode and consequently supplying a measurement result representing a compressive force gradient developed in the piezoelectric material.

14. A pressure sensor according to claim 11, comprising a voltmeter connected on the one hand in common to the first and second electrodes and on the other to the reinforcing material and thus supplying a measurement result representing the value of a compressive force exerted in the piezoelectric material.

* * * * *